United States Patent
Lopez-Estrada (10) Patent No.: US 7,245,237 B2
(45) Date of Patent: Jul. 17, 2007

(54) DIGITAL SAMPLING RATE CONVERSION USING A POLY-PHASE FILTER AND A POLYNOMIAL INTERPOLATOR

(75) Inventor: Alex A. Lopez-Estrada, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1229 days.

(21) Appl. No.: 10/245,547

(22) Filed: Sep. 17, 2002

(65) Prior Publication Data

US 2004/0052300 A1    Mar. 18, 2004

(51) Int. Cl.
*H03M 7/00*    (2006.01)
(52) U.S. Cl. .................... 341/61; 708/313; 375/242
(58) Field of Classification Search .............. 341/61; 708/313
See application file for complete search history.

(56) References Cited

U.S. PATENT DOCUMENTS

| | | | | |
|---|---|---|---|---|
| 4,799,179 | A | * | 1/1989 | Masson et al. ............. 708/313 |
| 5,274,372 | A | * | 12/1993 | Luthra et al. .................. 341/61 |
| 5,331,346 | A | * | 7/1994 | Shields et al. .............. 348/441 |
| 5,365,468 | A | * | 11/1994 | Kakubo et al. ............. 708/313 |
| 5,610,942 | A | * | 3/1997 | Chen et al. .................. 375/242 |
| 6,134,268 | A | * | 10/2000 | McCoy ........................ 375/229 |
| 6,411,225 | B1 | * | 6/2002 | Van Den Enden et al. ... 341/61 |
| 6,487,573 | B1 | * | 11/2002 | Jiang et al. ................. 708/313 |
| 6,546,407 | B2 | * | 4/2003 | Jiang et al. ................. 708/313 |
| 6,968,353 | B2 | * | 11/2005 | Schmidt ..................... 708/313 |
| 7,126,505 | B2 | * | 10/2006 | Avantaggiati ................ 341/61 |

* cited by examiner

*Primary Examiner*—Khai M. Nguyen
(74) *Attorney, Agent, or Firm*—Buckley, Maschoff & Talwalkar LLC (57) ABSTRACT

According to some embodiments, digital sampling rate conversion is performed using a poly-phase filter and a polynomial interpolator.

20 Claims, 10 Drawing Sheets

PRIOR ART

DIGITAL SAMPLING RATE CONVERSION USING A POLY-PHASE FILTER AND A POLYNOMIAL INTERPOLATOR

BACKGROUND

When performing Digital Signal Processing (DSP) on a digital signal, it is often necessary to convert the sampling rate associated with the signal. For example, a signal associated with a source sampling rate ($F_x$) may need to be converted into a signal associated with a different, destination sampling rate ($F_y$).

Typically, the source sampling rate and the destination sampling rate are pre-determined and an appropriate Sampling Rate Conversion (SRC) structure is designed to perform the task. For example, a filter may be designed for a specific application that requires a particular sampling rate ratio ($F_x/F_y$).

Figure 1:
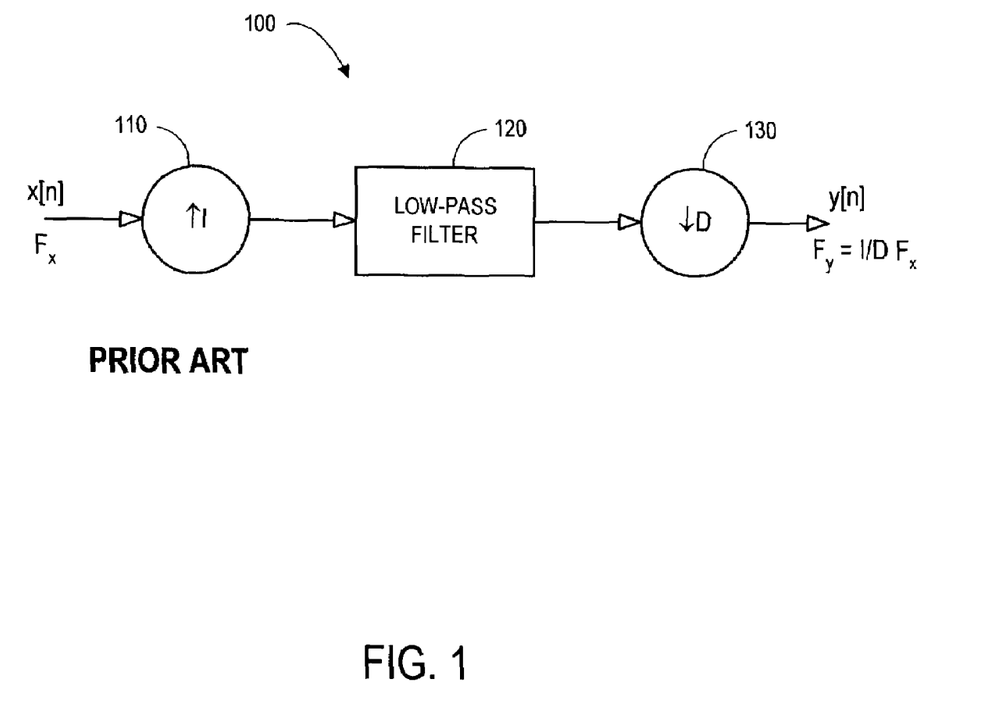
FIG. 1 is a block diagram of a traditional SRC structure.

FIG. 1 is a block diagram of a traditional SRC structure 100. In this case, a source signal x[n] is associated with source sampling rate $F_x$. An interpolation 110 (i.e., upsampling) by a factor of I is performed on the source signal. The interpolation 110 will also generally involve a low-pass filter 120 (e.g., an anti-aliasing filter). A decimation 130 (i.e., down-sampling) by a factor of D is then performed to create an output signal y[n] associated with a destination sampling rate $F_y$ (where $F_y$ equals I/D*$F_x$). The low-pass filter is designed to attenuate aliasing artifacts resulting from the up-sampling process and to band-limit the signal to avoid aliasing artifacts from decimation.

For example, converting a source sampling rate $F_x$ by a factor of 1.5 can be achieved through interpolation 110 by a factor of three and then decimation 130 by a factor of two. This approach, however, can be inefficient when a conversion requires interpolation 110 and/or decimation 130 by a large factor. By way of example, a conversion from 48 Kilohertz (KHz) to 44.1 KHz requires interpolation 110 by a factor of 147 and then decimation 130 by a factor of 160. These types of substantial interpolation and/or decimation factors may also require impractically large filters in order to meet Nyquist requirements.

Another disadvantage with the traditional approach is that a filter must be designed for a specific pair of sampling rates. That is, a filter that is designed to convert a source signal with a sample rate of 48 KHz into a destination signal with a sampling rate of 44.1 KHz cannot be used for source and/or destination signals that have other sampling rates.

DETAILED DESCRIPTION

Some embodiments described herein are associated with "arbitrary" sampling rates (e.g., arbitrary source or destination sampling rates). As used here, the term "arbitrary" may refer to any sampling rate that is not pre-determined (e.g., that is not known when a SRC structure is designed).

Moreover, as used herein lowercase variables will declare sequences in the time domain, while uppercase variables will declare frequency representations (e.g., x is a sequence represented in the time domain while X is the same variable represented in the frequency domain). The index [n] is used to represent the time index of sequences in the time domain (e.g., x[n]).

In addition, ω is the radian frequency normalized to the sampling frequency $F_s$:

$$\omega = \frac{2\pi f}{F_s};$$

$\lfloor x \rfloor$ represents the nearest integer less than or equal to x;
$\lceil x \rceil$ represents the nearest integer greater than or equal to x;
|x| represents the absolute value of x (or magnitude in the case of a complex number); and
the convolution of two time domain sequences x[n] and g[n], to produce time domain sequence y[n] is expressed as:

$$y[n] = x[n] * g[n] = \sum_{k=0}^{N-1} x[n-k]g[k]$$

where N is length of the sequence g[n].

Sampling Rate Conversion System

Figure 2:
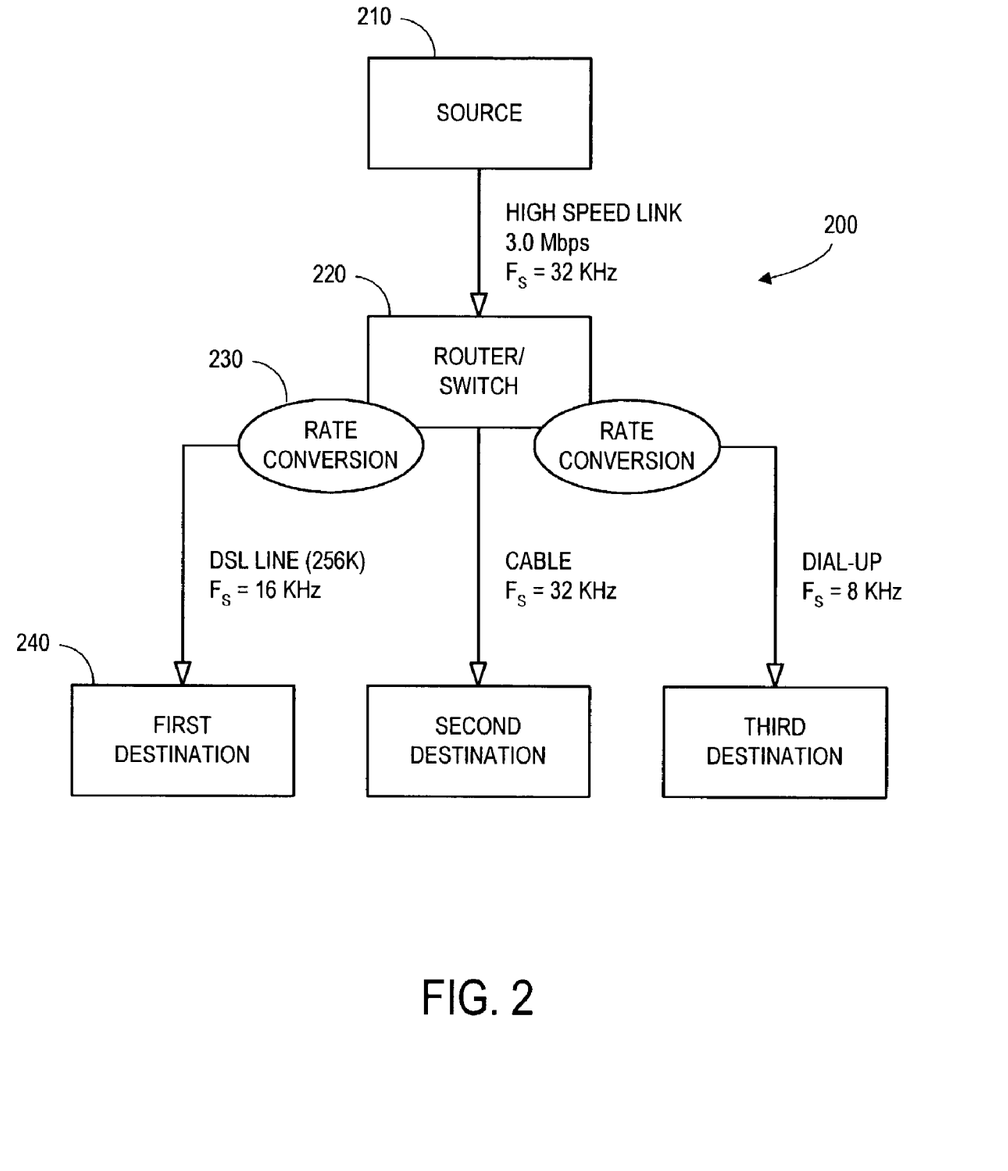
FIG. 2 is a block diagram of a SRC system according to some embodiments.

FIG. 2 is a block diagram of a SRC system 200 according to some embodiments. In particular, the SRC system 200 is associated with a Voice over Internet Packet (VoIP) digital network. A source 210 encodes voice information at a first rate (i.e., $F_s$ is 32 KHz) and transmits the information via a high speed link, such as a 3.0 Mega bits per second (Mbps) communication channel. Note that $F_s$ could be a pre-determined value or an arbitrary value.

The information is then received by a router or switch 220, which could simply forward the information to a destination 240 (e.g., the information would still be associated with $F_s$—as is the case with the second destination 240 illustrated in FIG. 2). Although a router or switch 220 is illustrated in FIG. 2, embodiments may use any type of signal processor.

The router or switch 220 may also perform a rate conversion 230 on the received information. As a result of the rate conversion 230, information can be transmitted to a destination 240 in accordance with a different sampling rate (e.g., as is the case with the first and third destinations 240). For example, a destination 240 associated with a slower link, such as a Digital Subscriber Line (DSL) line or a dial-up connection, might receive information associated with a reduced sampling rate (e.g., 16 or 8 KHz) in order to avoid audio breaks or missed packets.

Note that the potential speeds of various links between the router or switch 220 and the destinations 240 (and thus the sampling rates that will be appropriate for those links) might not be known when the rate conversions 230 are designed (e.g., a new technology might require a new sampling rate). Moreover, the speed of a particular link might dynamically change (e.g., the speed of a link might change due to traffic congestion).

Figure 3:
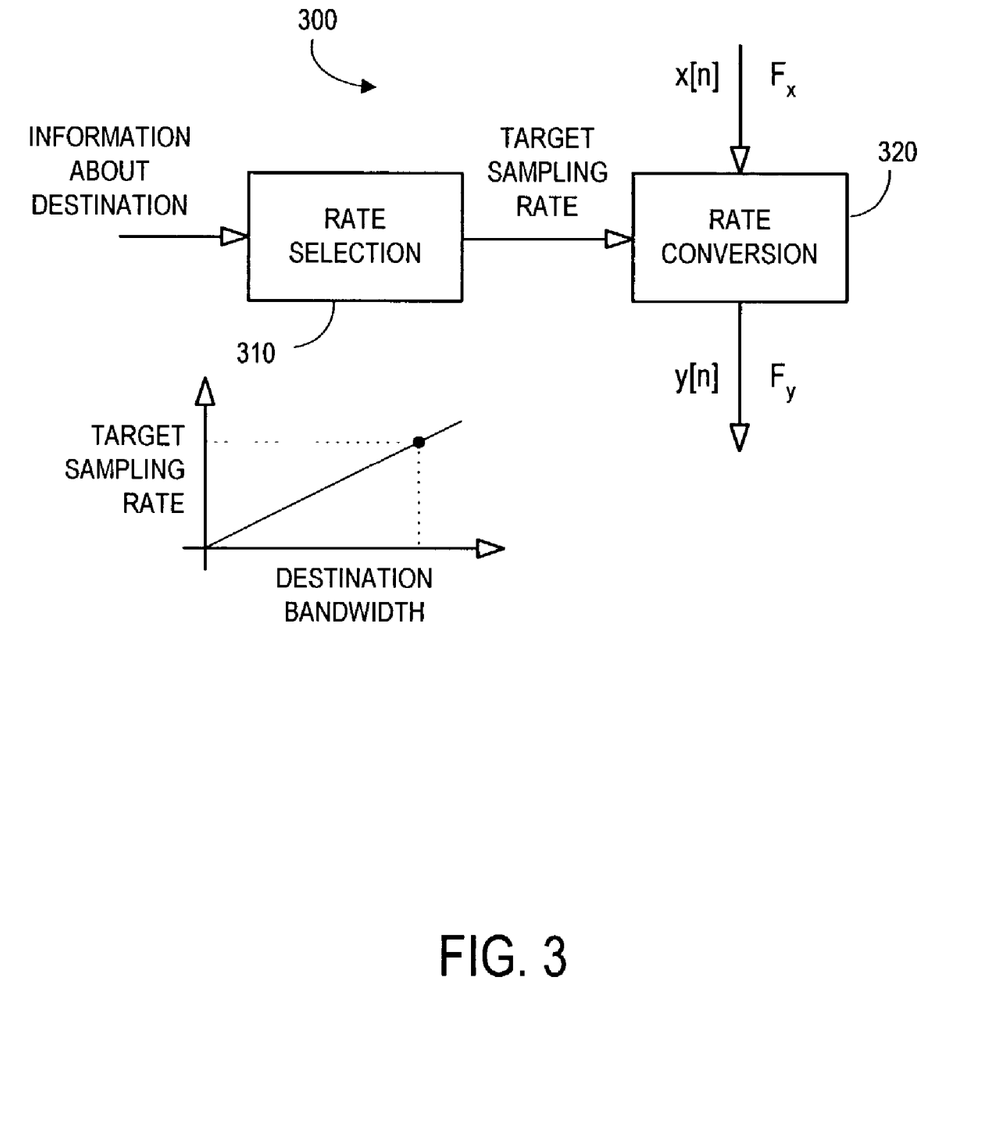
FIG. 3 is a block diagram illustrating how a target sampling rate may be selected according to some embodiments.

FIG. 3 is a block diagram of a system 300 that selects an appropriate destination or "target" sampling rate according to some embodiments. In particular, a rate selection 310 is performed based on information about the destination. The information about the destination may simply be the bandwidth of the communication channel associated with the destination (e.g., a pre-determined capacity associated with a particular type of channel or a current capacity that is available for a particular channel). For example, higher target sampling rates may be selected for destinations associated with higher bandwidths. According to other embodiments, the information about the destination could be a device identifier (e.g., a wireless telephone number) or device type (e.g., indicating that the device is a hand-held computer).

The target sampling rate may then be used in during a rate conversion 320 to generate information for the destination (e.g., by converting x[n] associated with $F_x$ into y[n] associated with $F_y$). Thus, this embodiment may dynamically determine an appropriate sampling rate for a link in accordance with the link's capacity.

Referring again to FIG. 2, the router or switch 220 may include an input port adapted to receive information from the source 210. Moreover, the rate conversion 230 may comprise a poly-phase filter that is coupled to the input port and generates a set of over-sampled signals. A polynomial interpolator may then use the over-sampled signals to generate information associated with one or more output sampling rates. This information may then be transmitted via an output port (e.g., to a destination 240). A more detailed example of a poly-phase filter and polynomial interpolator is provided with respect to FIGS. 4 through 6.

Although the SRC system 200 illustrated in FIG. 2 is associated with a VoIP network, embodiments may be associated with other types of digital signals. For example, the digital signals may be associated with multimedia information, such as image information (e.g., video information) or other types of audio information, including "MP3" files encoded in accordance with the International Organization for Standardization/International Electrotechnical Commission (ISO/IEC) standard 11172-3, entitled "Coding of Moving Pictures and Associated Audio for Digital Storage Media at up to About 1,5 Mbit/s—Part 3: Audio" (1999).

Moreover, a single element described in FIG. 2 may be implemented in more than one device or application (e.g., the rate conversion 230 may be performed in device other than the router or switch 220). Similarly, multiple elements described in FIG. 2 may be implemented in a single device or application. For example, all of the elements might be implemented in a single Personal Computer (PC).

According to some embodiments, the source 210 and/or a destination 240 may comprise a device, such as a PC, a wireless telephone, or a Personal Digital Assistant (PDA). According to other embodiments, the source 210 and/or a destination 240 instead comprises a software application or a peripheral (e.g., a sound card in a PC). According to still other embodiments, the source 210 and/or a destination may comprise an information file (e.g., the source 210 may be a locally stored MP3 file).

The information received from the source 210 and/or transmitted to a destination 240 may comprise, for example, streaming information (e.g., the source 210 may be a Web server adapted to stream video information). The information may also comprise stored information (e.g., a destination 240 may be an MP3 file that will be attached to an email message).

In the SRC system 200 illustrated in FIG. 2, information is received from a single source 210 and is provided to multiple destinations 240. According to other embodiments, information may be received from multiple sources 210 (e.g., to be provided to one or more destinations 240). Moreover, according to still other embodiments information is received from a single source 210 and is provided to a single destination 240 (e.g., when the source sampling rate and/or the destination sample rate is arbitrary).

Sampling Rate Conversion Structure

Figure 4:
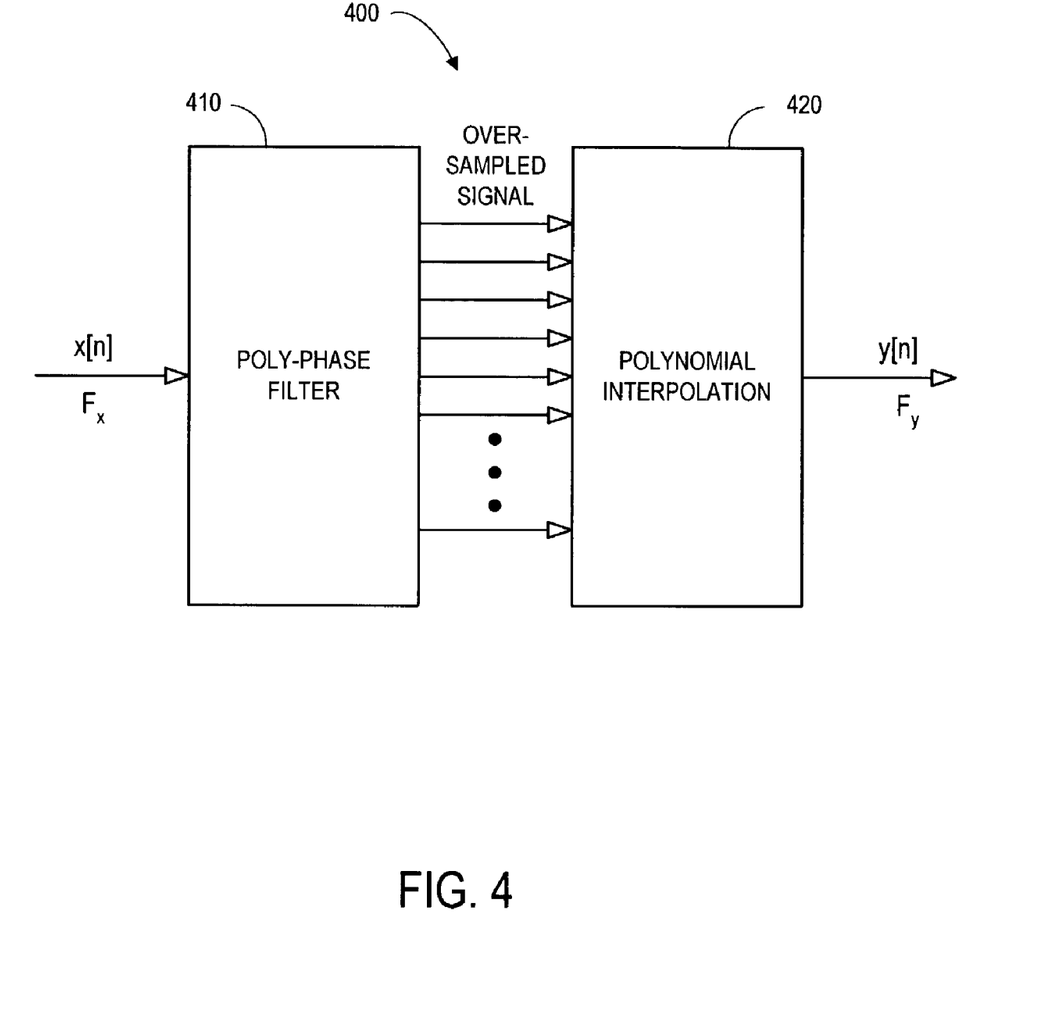
FIG. 4 is a block diagram of a SRC structure according to some embodiments.

FIG. 4 is a block diagram of a SRC structure 400 according to some embodiments. The SRC structure 400 includes a poly-phase filter 410 that receives information (i.e., x[n]) associated with an input sampling rate (i.e., $F_x$). Note that the input sampling rate may be an arbitrary sampling rate. The information may be received from, for example, a source device or information file. Based on x[n], the poly-phase filter 410 generates a set of over-sampled signals.

A polynomial interpolator 420 receives at least some of the over-sampled signals from the poly-phase filter 410. Based on the received over-sampled signals, the polynomial interpolator 420 provides information (i.e., y[n]) associated with an output sampling rate (i.e., $F_y$). Note that the output sampling rate may be an arbitrary sampling rate. The information may be provided to, for example, a destination device or information file.

Figure 5:
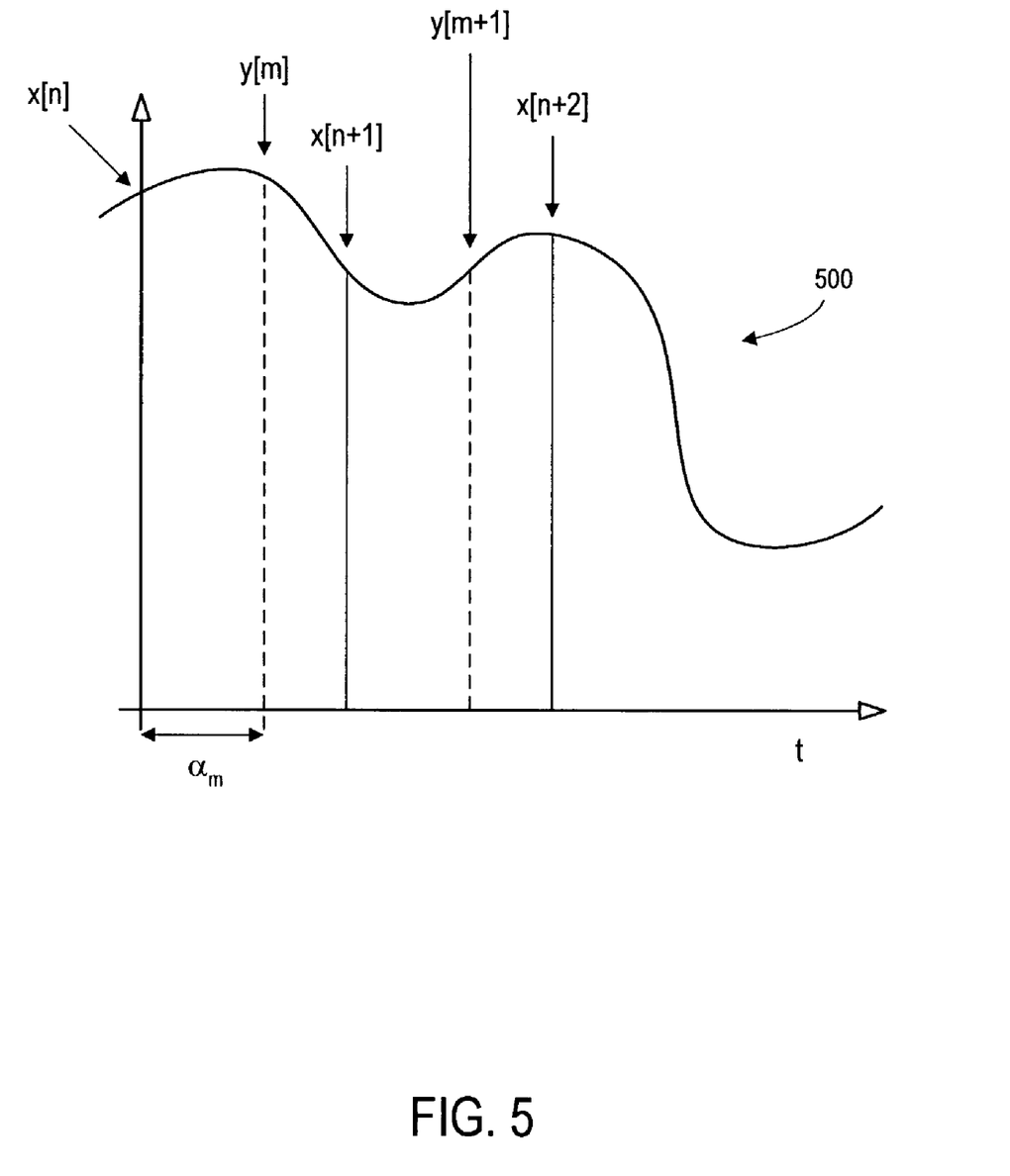
FIG. 5 illustrates SRC interpolation according to some embodiments.

The polynomial interpolation 420 may perform a non-exact rate conversion, such a zero or higher order approximation. For example, FIG. 5 illustrates SRC interpolation 500 according to some embodiments. In particular, the SRC interpolation is a first order approximation (i.e., a linear interpolation) where the output sample at a specific delay (e.g., $\alpha_m$) is approximated by a combination of neighbor samples. In other words, the value of y[m] would be based on the values of x[n] and x[n+1]. According to other embodiments, a zero order or second order approximation may be performed instead.

Sampling Rate Conversion Example

Any non-exact approximation will introduce distortion to the signal. In particular, if a signal with a flat spectrum up to $\omega_x$ is interpolated by a factor I, the Signal-to-Distortion Ratio (SDR) introduced by linear interpolation is:

$$SDR \geq \frac{80 I^4}{w_\lambda^4}$$

By way of example, consider a system that must have a maximum SDR of 96 db. Because the SDR is a function of distortion introduced by both the anti-aliasing filters and the linear interpolation, half the distortion might be allocated to the filter (and the other half to the interpolation). In this case, the SDR requirement for the linear interpolator would be 99 db. For a signal with a flat spectrum up to $0.8\pi$, the amount of interpolation required such that the SDR is at least 99 db is:

$$I \geq \omega_\lambda \sqrt[4]{\frac{10^{99}}{80}} = 251$$

That is, the input signal must be over-sampled by a factor of at least 251 in order to meet the SDR requirement. Once the signal is interpolated by 251, a sampling rate conversion of any arbitrary factor may be accomplished.

Figure 6:
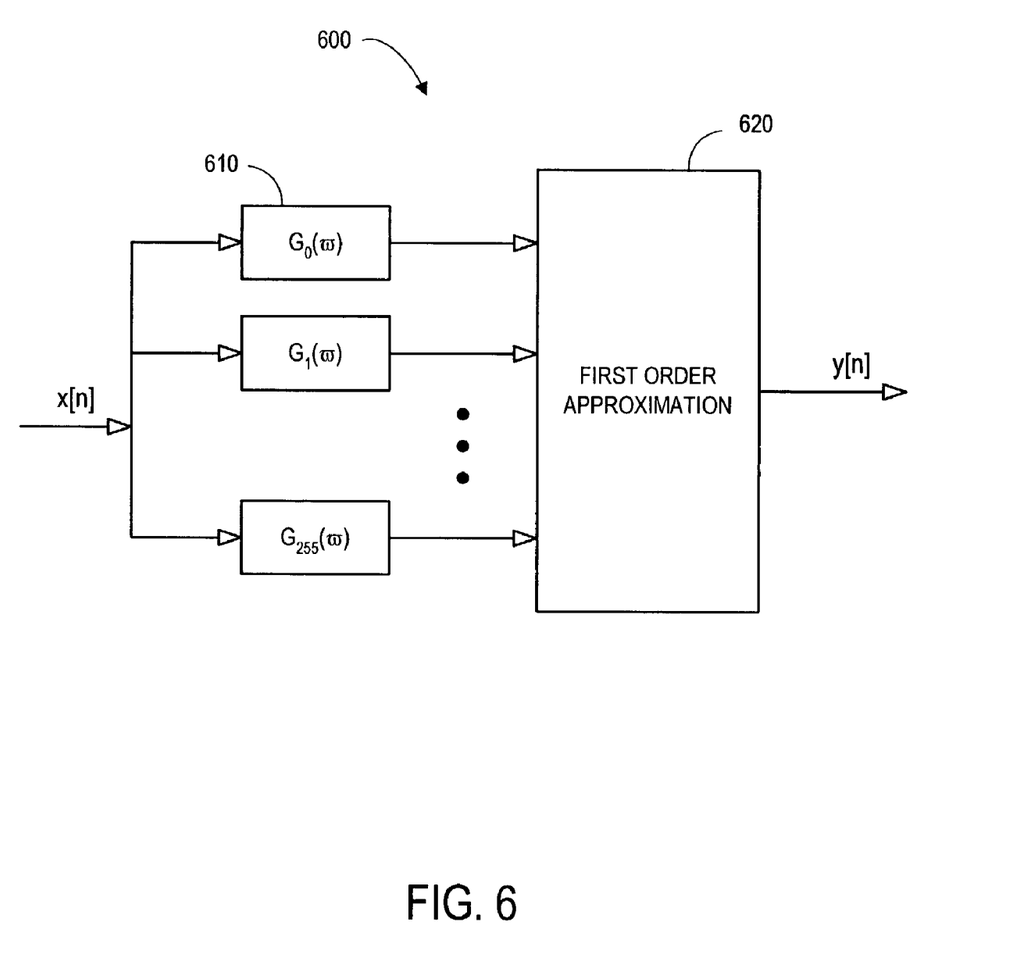
FIG. 6 is an example of a SRC structure according to one embodiment.

FIG. 6 is an example of a SRC structure 600 according to this embodiment. In particular, a poly-phase structure is provided with 256 sub-filters 610, identified as $G_k(\omega)$ where k equals 0 through 255. Each sub-filter 610 may have N/256 taps, where N is the number of taps for an anti-aliasing filter designed to have a stop band at $\pi/256$. The time delay corresponding to each sub-filter 610 is given by:

$$\text{delay} = \frac{k}{256} \quad k = 0, 1, 2, \ldots, 255$$

Note that it may not be necessary to compute all 256 outputs for each input sample in order to achieve sampling rate conversion. That is, a subset of the information from the sub-filters 610 may be selected based on the desired input/output sampling rate relationship. The desired delay is given by:

$$\delta_m = \frac{L}{M} \cdot m - \left\lfloor \frac{L}{M} \cdot m \right\rfloor \quad m = 0, 1, 2, \ldots, M-1$$

Note that $0 \leq \delta_m \leq 1$. Also, L/M is the integer ratio for the desired conversion (e.g., 147/160 in the case of a 44.1 KHz to 48 KHz conversion). In addition, the delay wraps around at m=M, and thus the input and the output are synchronized at every M output samples. The two closest outputs from the poly-phase filter bank to be used for linear interpolation are given by k and k+1, where k is obtained by finding the nearest filter delay:

$$k = \lfloor \delta_m \cdot 256 \rfloor$$

Therefore, to construct the output sample y[n], linear interpolation is performed on the convolved outputs of filters k and k+1:

$$y[n] = \begin{cases} (1-\alpha_m) \cdot x[n]^* g_k[n] + \alpha_m \cdot x[n] * g_{k+1}[n] & k < 255 \\ (1-\alpha_m) \cdot x[n]^* g_{255}[n] + \alpha_m \cdot x[n] * g_0[n] & k = 255 \end{cases}$$

Note that the coefficient $\alpha_m$ represents the distance between the selected filter k and the desired value (e.g., as illustrated in FIG. 5):

$$\alpha_m = \delta_m \cdot 256 - \lfloor \delta_m \cdot 256 \rfloor$$

Sampling Rate Conversion Method

Figure 7:
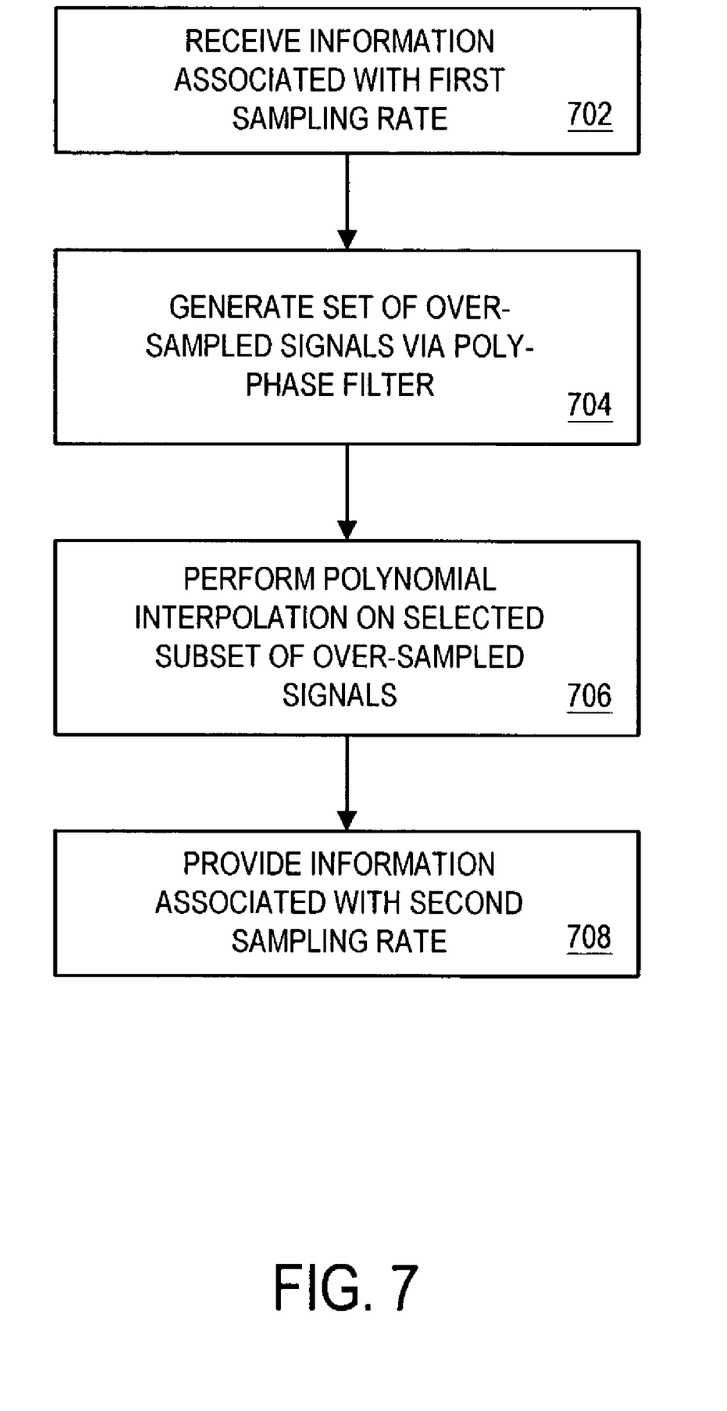
FIG. 7 is a flow chart of a method according to some embodiments.

FIG. 7 is a flow chart of a method according to some embodiments. The flow chart described herein does not imply a fixed order to the actions, and embodiments may be practiced in any order that is practicable. The method may be associated with, for example, the SRC structure 600 illustrated in FIG. 6.

At 702, information associated with an input sampling rate is received. For example, x[n] associated with an arbitrary source sampling rate might be received from a source device or information file.

A set of over-sampled signals is then generated via a poly-phase filter based on x[n] at 704. At 706, a polynomial interpolation (e.g., a zero or higher order approximation) is performed on a subset of the over-sampled signals to generate information associated with an output sampling rate. For example, y[n] associated with an arbitrary destination sampling rate might be generated.

Information associated with the output sampling rate is then provided at 708. For example, y[n] may be provided to a destination device or information file.

Multi-Stage Sampling Rate Conversion Structure

Figure 8:
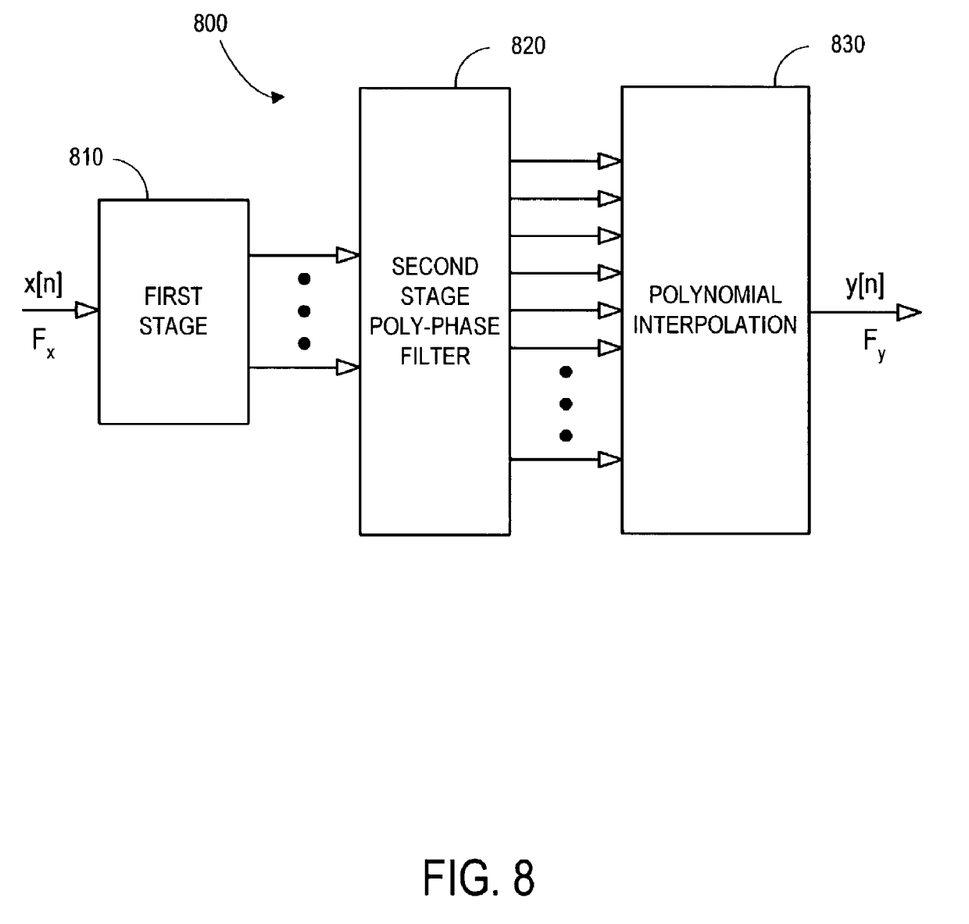
FIG. 8 illustrates a multi-stage SRC structure according to some embodiments.

It might be difficult to design an appropriate filter for interpolation by a large factor (e.g., by a factor of 256) using standard Finite Impulse Response (FIR) filter techniques. According to some embodiments, a multi-stage filtering scheme is used to reduce this problem. For example, the multi-stage SRC structure 800 illustrated in FIG. 8 uses first and second stage filters 810, 820 to generate information for the polynomial interpolation 830.

Figure 9:
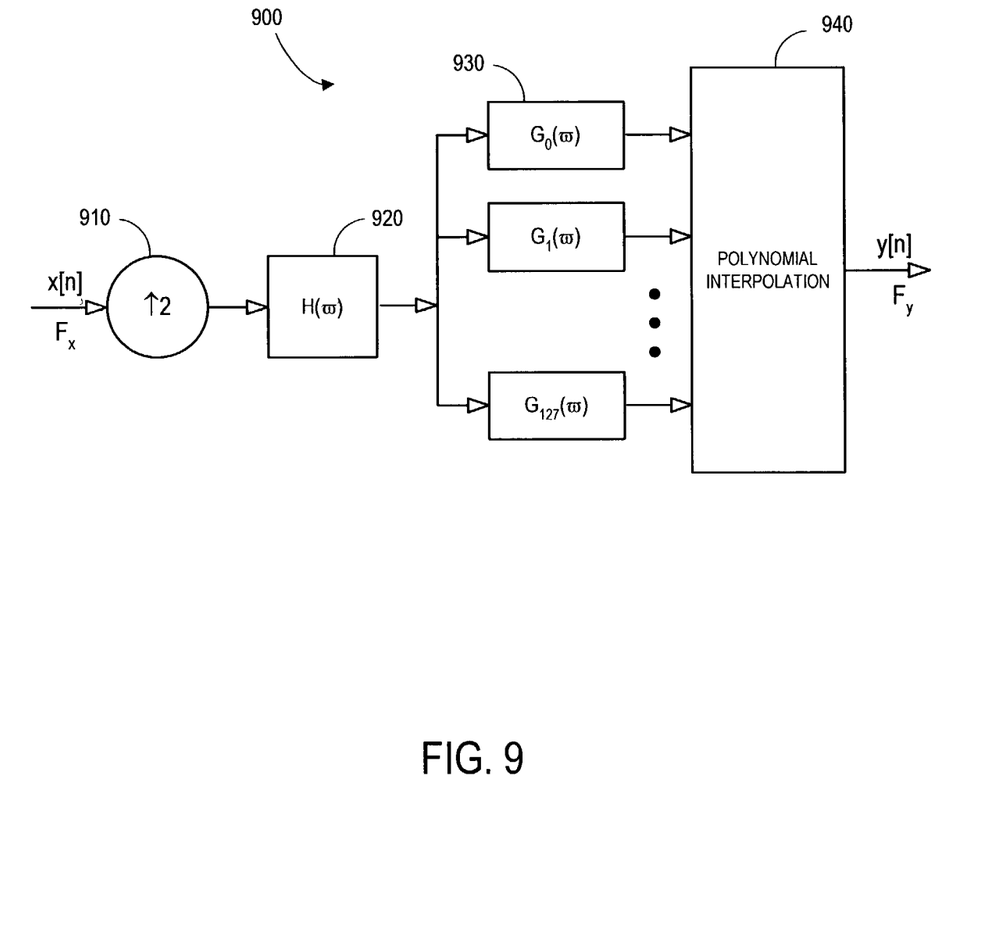
FIG. 9 is an example of a multi-stage SRC structure according to one embodiment.

As a more specific example, FIG. 9 illustrates a two-stage SRC structure 900 according to one embodiment. A first stage comprises an interpolation 910 by a factor of two followed by a filter $H(\omega)$ 920.

A second stage 930 comprises a poly-phase filter bank that interpolates the signal from $H(\omega)$ 920 by a factor of 128. Note that the first stage interpolation 910 may relax the transition and stop band requirements of the poly-phase filter as compared to the structure described with respect to FIG. 6 (e.g., because the signal has already been band limited by the first interpolation 910).

The first stage may be designed to have a pass band extending from 0 to $0.8\pi/2$, and the transition band extending up to $\pi/2$. The second stage may be designed to have a pass band from 0 to $0.8\pi/256$, and a transition band extending to $\pi/64-\pi/256$. The equations described above with respect to FIG. 6 then become:

$$\text{delay} = \frac{k}{128} \quad k = 0, 1, 2, \ldots, 127$$

$$\delta_m = \frac{2L}{M} \cdot m - \left\lfloor \frac{2L}{M} \cdot m \right\rfloor \quad m = 0, 1, 2, \ldots, M-1$$

$$k = \lfloor \delta_m \cdot 127 \rfloor$$

$$y[n] = \begin{cases} (1-\alpha_m) \cdot x[n]^* g_k[n] + \alpha_m \cdot x[n] * g_{k+1}[n] & k < 127 \\ (1-\alpha_m) \cdot x[n]^* g_{127}[n] + \alpha_m \cdot x[n] * g_0[n] & k = 127 \end{cases}$$

$$\alpha_m = \delta_m \cdot 128 - \lfloor \delta_m \cdot 128 \rfloor$$

Note that due to the linear property of convolution, the equation for y[n] may become:

$$y[n] = x[n] * g_m[n]$$

where:

$$g_m[n] = \begin{cases} (1-\alpha_m) \cdot^* g_k[n] + \alpha_m \cdot g_{k+1}[n] & k < 127 \\ (1-\alpha_m)^* g_{127}[n] + \alpha_m \cdot g_0[n] & k = 127 \end{cases}$$

Thus, in applications where the input and output sampling rate ratio is known beforehand, the filter coefficients $g_m[n]$ may be pre-computed. In situations where input and output sampling rates change periodically, the filter coefficients might also be pre-computed once per dynamic period. As a result, only one convolution of the interpolated signal may be required and computational performance may be improved. In other words, the signal may be convolved with an interpolated version of the filters.

Multi-Stage Buffer

Consider now a streaming application (e.g., a streaming audio application) where operations are performed on a block-by-block basis. When the SRC operation is performed in blocks of Pulse Code Modulated (PCM) samples, it may be the case that the input PCM samples are not fully consumed to generate the converted output samples.

Figure 10:
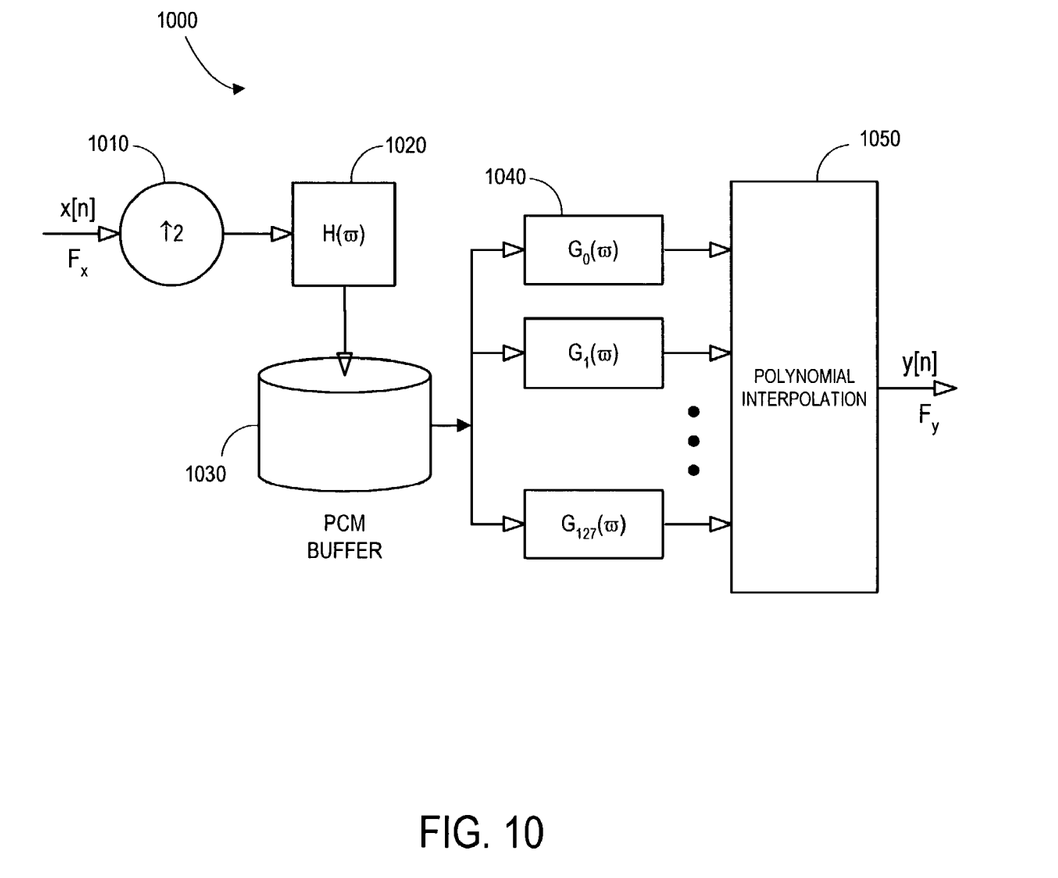
FIG. 10 illustrates a multi-stage SRC structure including a buffer according to one embodiment.

To deal with this potential problem, an intermediate buffer can be provided in a multi-stage filter design. For example, FIG. 10 illustrates a multi-stage SRC structure 1000 according to this embodiment. As before, a first stage comprises an interpolation 1010 by a factor of two followed by a filter $H(\omega)$ 1020.

In this case, however, a PCM digital audio sample buffer 1030 stores information from $H(\omega)$ 1020 and provides information to a second stage 1040 (i.e., a poly-phase filter bank that interpolates the signal from $H(\omega)$ 1020 by a factor of 128 and provides a set of signals to a polynomial interpolation 1050). That is, the PCM buffer 1030 keeps interpolated samples from the first stage. The output stage retrieves samples from the PCM buffer 1030 based on the demand for samples in the second stage 1040, in order to generate the required number of output samples.

The size of the PCM buffer 1030 may be associated with the input/output sampling ratio and the number of samples in each input block to be processed. The number of output samples at any specific input block instance may vary depending on the samples available in the PCM buffer 1030. For example, the number of output samples generated for every input block i may be:

$$N_{out}(i) = \left\lfloor N_{buffer}(i) \cdot \frac{F_{out}}{2F_{in}} \right\rfloor$$

where $N_{buffer}$ is the number of samples available n the buffer at any specific block instance, and is given by:

$$N_{buffer}(i) = 2N_m(i) + N_{extra}(i)$$

where $N_{in}$ is the number of samples in one input block. $N_{extra}$ is the number of samples remaining in the buffer from the previous iteration:

$$N_{extra}(i) = N_{buffer}(i-1) - \left\lfloor N_{out}(i-1) \cdot \frac{2F_{in}}{F_{out}} \right\rfloor$$

where $N_{extra}(0) = 0$ and the second term in the equation represents the total number of samples consumed during the previous iteration. Moreover, the size of the PCM buffer 1030 may be adjusted based on input and/or output sampling rates (e.g., by dynamically adjusting the size of the PCM buffer 1030).

Thus, embodiments may provide a SRC structure to handle an arbitrary source sampling rate and/or an arbitrary destination sampling rate.

Additional Embodiments

The following illustrates various additional embodiments. These do not constitute a definition of all possible embodiments, and those skilled in the art will understand that many other embodiments are possible. Further, although the following embodiments are briefly described for clarity, those skilled in the art will understand how to make any changes, if necessary, to the above description to accommodate these and other embodiments and applications.

Although particular embodiments have been described herein (e.g., a VoIP network), any number of other embodiments may also be implemented. For example, a software application may convert an MP3 file encoded at one sampling rate into an MP3 file encoded at another sampling rate.

Moreover, although hardware or software implementations have been described with respect to some embodiments, embodiments may be implemented using any combination of software, such as the INTEL® Integrated Performance Primitives (IPP) Version 3.0 library, and/or hardware, such as hardware associated with Very High Speed Integrated Circuit (VHDL) logic.

The several embodiments described herein are solely for the purpose of illustration. Persons skilled in the art will recognize from this description other embodiments may be practiced with modifications and alterations limited only by the claims.

What is claimed is:

1. An apparatus, comprising:
   a multi-stage poly-phase filter to receive information associated with an input sampling rate, wherein a stage in the multi-stage, poly-phase filter is associated with pre-computed filter coefficients;
   a buffer between two of the filter stages, wherein the size of the buffer is adjusted based on at least one of the input sampling rate and an output sampling rate; and
   a polynomial interpolator to receive over-sampled signals from the poly-phase filter and to provide information associated with the output sampling rate.

2. The apparatus of claim 1, wherein at least one of the input sampling rate and the output sampling rate comprise an arbitrary sampling rate.

3. The apparatus of claim 1, wherein the polynomial interpolator is associated with a zero or higher order approximation.

4. The apparatus of claim 1, wherein at least one of the received information and the provided information is associated with at least one of: (i) a stream of information, or (ii) stored information.

5. The apparatus of claim 1, wherein at least one of the received information and the provided information is associated with at least one of: (i) multimedia information, (ii) audio information, (iii) image information, (iv) video information, or (v) voice over Internet packet network information.

6. The apparatus of claim 1, wherein at least one of the poly-phase filter and the polynomial interpolator is associated with at least one of: (i) a hardware device, and (ii) a software application.

7. A method, comprising: generating via a multi-stage poly-phase filter a set of over-sampled signals based on information associated with an input sampling rate, wherein a stage in the filter is associated with pre-computed filter coefficients, and said generating is performed using at least one buffer between two of the filter stages, wherein the size of the buffer is adjusted based on at least one of the input sampling rate and an output sampling rate; and performing a polynomial interpolation on a subset of the over-sampled signals to generate information associated with the output sampling rate.

8. The method of claim 7, further comprising: determining the output sampling rate.

9. The method of claim 8, wherein the determination is based on at least one of: (i) information associated with a destination device, (ii) a destination device identifier, (iii) a destination device type, (iv) a communication channel, or (v) bandwidth information.

10. The method of claim 7, further comprising: receiving the information associated with the input sampling rate.

11. The method of claim 7, further comprising: providing the information associated with the output sampling rate.

12. The method of claim 7, further comprising: selecting the subset of over-sampled signals.

13. The method of claim 12, wherein the selection is based on a delay associated with:

$$\delta_m = \frac{L}{M} \cdot m - \left\lfloor \frac{L}{M} \cdot m \right\rfloor \quad m = 0, 1, 2, \ldots, M-1$$

where L/M is an integer ratio associated with the input sampling frequency divided by the output sampling frequency and $\delta_m$ is associated with an appropriate delay.

14. The method of claim 13, wherein at least one of the input sampling rate and the output sampling rate comprise an arbitrary sampling rate.

15. The method of claim 14, wherein the polynomial interpolation is associated with a zero or higher order approximation.

16. A computer-readable medium storing instructions adapted to be executed by a processor to perform a method, said method comprising:

generating, via a multi-stage poly-phase filter, a set of over-sampled signals based on information associated with an input sampling rate, wherein a stage in the filter is associated with pre-computed filter coefficients, and said generating is performed using at least one buffer between two of the filter stages, wherein the size of the buffer is adjusted based on at least one of the input sampling rate and an output sampling rate; and performing a polynomial interpolation on a subset of the over-sampled signals to generate information associated with the output sampling rate.

17. The medium of claim 16, wherein at least one of the input sampling rate and the output sampling rate comprise an arbitrary sampling rate.

18. A network device, comprising:

an input port adapted to receive information associated with an arbitrary input sampling rate;

a multi-stage poly-phase filter coupled to the input port and adapted to generate a set of over-sampled signals, wherein a stage in the multi-stage, poly-phase filter is associated with pre-computed filter coefficients;

a buffer between two of the filter stages, wherein the size of the buffer is adjusted based on at least one of an input sampling rate and an output sampling rate;

a polynomial interpolator coupled to the poly-phase filter and adapted to perform a first order approximation to generate information associated with the output sampling rate; and an output port coupled to the polynomial interpolator and adapted to provide information associated with an arbitrary output sampling rate.

19. The network device of claim 18, wherein the input port receives information from a source device and the output port provides information to a destination device.

20. The network device of claim 18, wherein the network device is associated with at least one of: (i) a switch, or (ii) a router.

* * * * *